(12) United States Patent
Esguevillas et al.

(10) Patent No.: US 7,795,969 B2
(45) Date of Patent: Sep. 14, 2010

(54) DIGITAL AMPLIFIER

(75) Inventors: Javier F. Esguevillas, Madrid (ES); Matthias Wendt, Wuerselen (DE); Roger Steadman, Aachen (DE)

(73) Assignee: NXP B.V., Eindhoven (NL)

( * ) Notice: Subject to any disclaimer, the term of this patent is extended or adjusted under 35 U.S.C. 154(b) by 707 days.

(21) Appl. No.: 10/552,058

(22) PCT Filed: Mar. 23, 2004

(86) PCT No.: PCT/IB2004/000936
§ 371 (c)(1),
(2), (4) Date: May 2, 2008

(87) PCT Pub. No.: WO2004/091092
PCT Pub. Date: Oct. 21, 2004

(65) Prior Publication Data
US 2008/0197930 A1  Aug. 21, 2008

(30) Foreign Application Priority Data
Apr. 7, 2003  (EP)  ................................ 03100920

(51) Int. Cl.
*H03G 3/20*  (2006.01)
(52) U.S. Cl. .................... 330/136; 330/207 A; 330/297
(58) Field of Classification Search .................. 330/10, 330/136, 146, 175, 207 A, 251, 297
See application file for complete search history.

(56) References Cited

U.S. PATENT DOCUMENTS

| | | | |
|---|---|---|---|
| 4,409,559 A * | 10/1983 | Amada et al. | 330/297 |
| 4,453,264 A | 6/1984 | Hochstein | |
| 5,442,317 A * | 8/1995 | Stengel | 330/146 |
| 6,160,455 A * | 12/2000 | French et al. | 330/297 |
| 6,982,593 B2 * | 1/2006 | Robinson et al. | 330/297 |

FOREIGN PATENT DOCUMENTS

| | | |
|---|---|---|
| EP | 0 541 933 A1 | 5/1993 |
| WO | WO 02/078179 A2 | 10/2002 |

OTHER PUBLICATIONS

Bang W. Lee, Yi S. Bae and Sang Y Baek, "Power Supply Ripple Reduction Techniques for Switched-Capacitor Circuits," IEEE Symposium on Circuits and Systems, Jun. 11-14, 1991, vol. 3, pp. 1581-1584.

* cited by examiner

*Primary Examiner*—Khanh V Nguyen

(57) ABSTRACT

Recently, the use of class D audio amplifiers has become more and more widespread. In contrast to the generally employed class A-B linear amplification technology, class D allows for improved efficiency. However, the class D principle is known for its poor distortion characteristics. According to the present invention, a digital amplifier is provided for converting an input signal to a power output. The digital amplifier according to the present invention comprises a supply ripple pre-compensation circuit for compensating voltage ripples on a supply voltage supplied to bridge circuits of the digital amplifier on the basis of the input signal. By this, supply ripples in the supply voltage supplied to the bridge which have been found to cause a major part of the distortions in the output signal of the digital amplifier may be compensated.

14 Claims, 3 Drawing Sheets

DIGITAL AMPLIFIER

The present invention relates to the field of digital amplifiers, which directly convert digital signals to a power output. In detail, the present invention relates to a digital amplifier for converting an input signal to a power output, to a digital amplifier system for converting a plurality of input signals to a plurality of power outputs, to a compensation circuit for connection between a power supply and a class D amplifier and to a method of operating a class D amplifier.

Several types of power-amplifier output stages have been developed. Conveniently, they were labeled as, e.g. class A amplifiers, class B amplifiers and class C amplifiers. More recently, class D amplifiers appeared. Class A, B, AB, and D are common in low-frequency audio designs and have some applications in other areas, such as servo-motor drives and RF amplification. Class C, class E and F types are usually only used in RF applications.

In recent years, in particular the class D amplifiers have become increasingly popular due to their drastically improved efficiency in contrast to the generally employed class AB linear amplification technology. Class D amplifiers are generally described in Carsten Nielsen, "High Fidelity PWM based Amplifier Concept for Active Speaker Systems with a very low Energy Consumption", ($100^{th}$ AES Convention, Copenhagen, May 1996, pre-print 4259), which is hereby incorporated by reference.

The development of class D amplifiers represents an effort to improve amplifier efficiency. Similar in scheme to a switching regulator, a class D amplifier, pulse-width-modulates the audio-input signal with a higher frequency square wave so that audio-signal information becomes the variations in pulse-width of the modulation signal. This modulation signal feeds a set of half bridge switches, usually called H-bridges, and each H-bridge consists of two power MOS-FETs. Unlike with class A or B structures, the amplifier load or the loudspeaker is placed across the legs of the bridge instead of from the output to the ground. This configuration allows the amplifier to reproduce low-frequency signals as low as 20 Hz without requiring bipolar power supplies or without introducing a DC offset in the output.

In spite of becoming more and more popular, class D audio amplifiers are known for their poor distortion characteristics. Attempts were made to filter the modulated output to remove high-frequency signals and recover the amplified input signals. Filter configurations such as two-pole Butterworth filters, two-pole Chebyshev or two-pole Bessel filters are known which either did not deliver satisfying results or caused significant efforts and costs.

It is an object of the present invention to avoid distortions in digital amplifiers.

As used herein, the term "digital amplifier" applies to an amplifier which directly converts to a power output.

According to an exemplary embodiment of the present invention, the above object may be solved with a digital amplifier for converting an input signal to a power output comprising a bridge circuit with at least one pair of switches and a supply ripple pre-compensation circuit. The supply ripple pre-compensation circuit is arranged for compensating voltage ripples on a supply voltage supplied to the bridge circuit. According to an aspect of the present invention the supply ripple pre-compensation circuit compensates the voltage ripples on the supply voltage based on the input signal.

According to an aspect of the present invention it has been found out that a significant portion of the distortions of the digital amplifier is caused by ripples in the supply voltage of the digital amplifier. In this respect it has to be noted that with regard to this application, the term "ripples" is not limited to 100 Hz ripples or the like, but refers to disturbances, unwanted waviness and ripples, e.g. within a 20 KHz band width of the output signal of an audio amplifier. Also, the term "compensation" includes any suppression or equalization. In particular, in the case of a class D amplifier, it has been found out that one of the important distortion sources in feed forward class—D amplifiers is the supply voltage ripple at the full bridge caused by voltage drops due to the load current changes. Amplifiers with feedback, such as for example class A-B amplifiers inherently have excellent power supply ripple rejection. However, such conventional class A-AD amplifying technology cannot be applied to fully digital audio amplifiers without any feedback.

Advantageously, the digital amplifier according to the present invention may be applied to fully digital audio amplifiers without any feedback and ensures improved total harmonic distortion figures due to supply ripple effects.

Advantageously, due to the supply ripple pre-compensation based on the input signal, inputs can be delivered to the bridge circuit load just in time of its demand, provided that this demand is defined by the input signal. Advantageously, this not only ensures a clean supply voltage with minimal ripple, but also means that an energy storage of the power supply can be reduced in relation to known solutions.

According to an exemplary embodiment of the present invention as set forth in claim 2, the digital amplifier includes a filter for filtering the input signal, which is an audio signal. According to this exemplary embodiment of the present invention, only a part of a frequency content of the audio signal is fed forward for pre-compensating ripples on the supply voltage. Such band width limited feed forward signal injection is based on the assumption that most audio signal content is in the low-frequency range of the signal. Therefore, while ensuring that the primary part and most important part of the audio signal content is fed forward, the audio signal can be previously low pass filtered to ease the power supply controller without having a loss of performance.

According to another exemplary embodiment of the present invention as set forth in claim 3, the supply ripple pre-compensation circuit is one of a digital controller and an analog control circuit and the digital amplifier is a class D amplifier, which allows for a very effective compensation of the ripples and therefore for a clean and undisturbed output signal.

According to another exemplary embodiment of the present invention as set forth in claim 4, a digital amplifier system is provided for converting a plurality of input signals to a plurality of power outputs. According to this exemplary embodiment of the present invention, the above described ripple pre-compensation scheme is applied to more than one channel in a multi-channel application (e.g. left and right sides in a stereo amplifier). This exemplary embodiment of the present invention is based on the assumption that the low frequency content is common to all channels. Thus, satisfying results may be achieved by low pass filtering only one channel of the channels and using the low pass filtered signal of this one channel for pre-compensation of all amplified channels.

According to further exemplary embodiments of the present invention as set forth in claims 5 and 6, a plurality of input signals such as different channels of an audio signal are individually squared and then added up and input to the pre-compensation circuit for performing the supply ripple pre-compensation for the plurality of output channels. The firstly squared and then added-up signal represents the total energy which is drawn from the power supply and therefore can be used for the above described pre-compensation.

Further exemplary embodiments of the present invention as set forth in claims 7 and 8 provide for a compensation circuit for connection between a power supply and a class D amplifier applying the above described pre-compensation where the supply ripple pre-compensation circuit compensates the voltage ripples on the supply voltage based on the input signals. Advantageously, this compensation circuit may be used in already existing circuit configurations and allows for the provision of a clean supply voltage to the bridge of the class D amplifier.

Claims 9, 10 and 11 provide for a method of operating a class D amplifier which converts an input signal to a power output which allows and operation of the class D amplifier with reduced distortions.

It may be seen as the gist of an exemplary embodiment of the present invention that ripples on a supply voltage to digital amplifiers are compensated for on the basis of information in the input signal. In case of audio signals, the content of the audio signal corresponds or defines the load demand of the digital amplifier. This not only ensures a clean supply voltage with minimal ripple, but also means that advantageously the energy storage of the power supply can be reduced.

These, and other aspects of the present invention are apparent and will be elucidated with reference to the embodiments described hereinafter and with reference to the following drawings.

Figure 1:
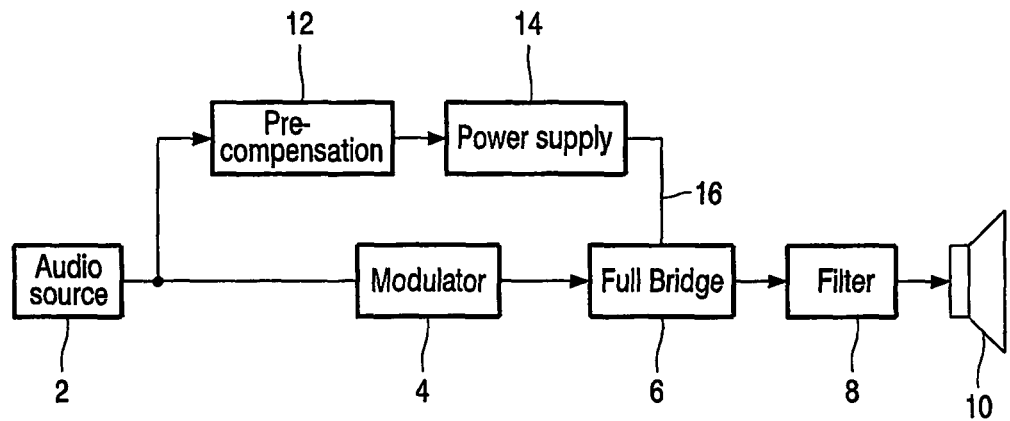
FIG. 1 shows a schematic diagram of a first exemplary embodiment of a digital amplifier according to the present invention.
Figure 3:
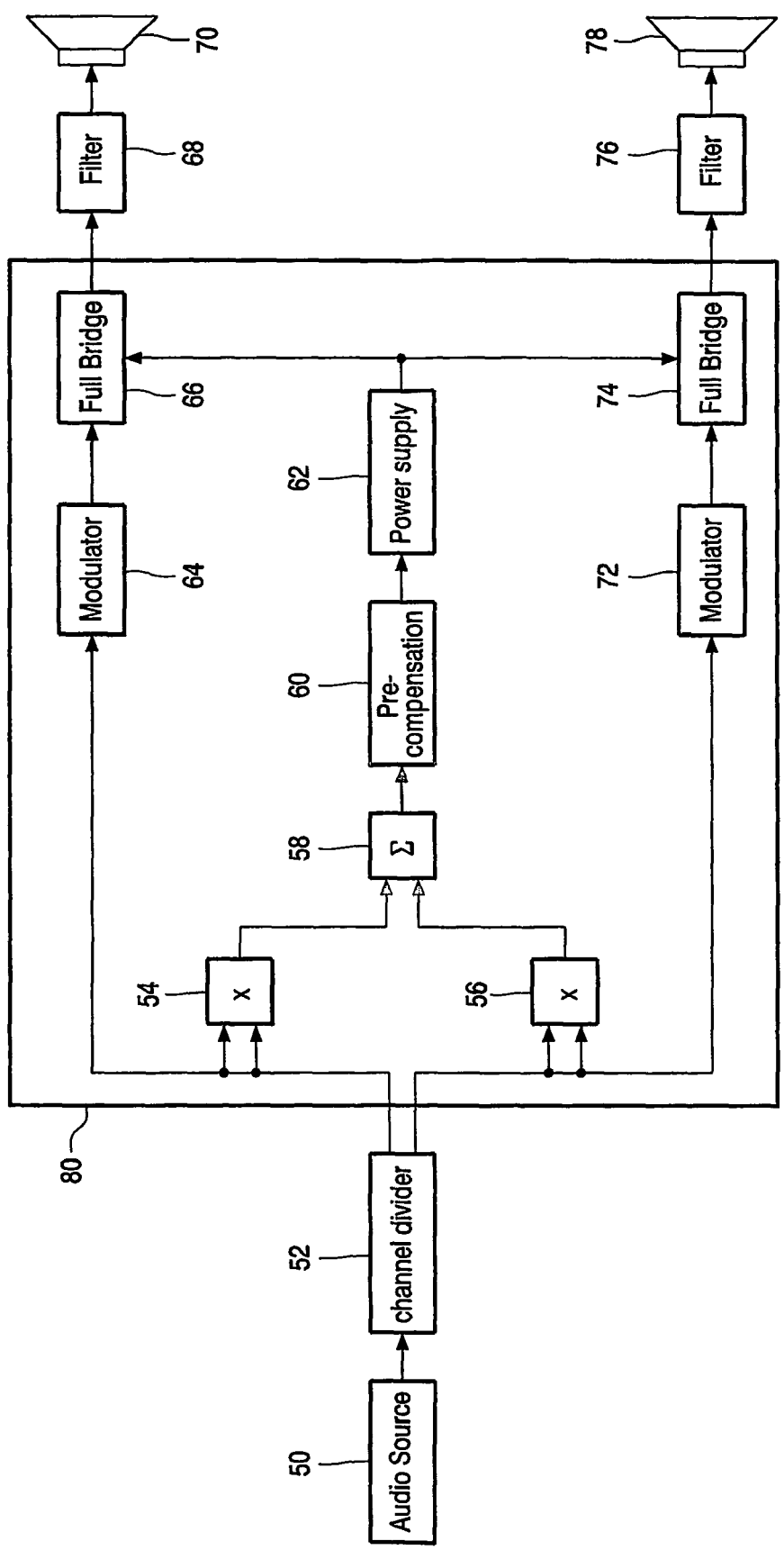
FIG. 3 shows a schematic diagram of a first exemplary embodiment of a digital amplifier system according to the present invention.
Figure 4:
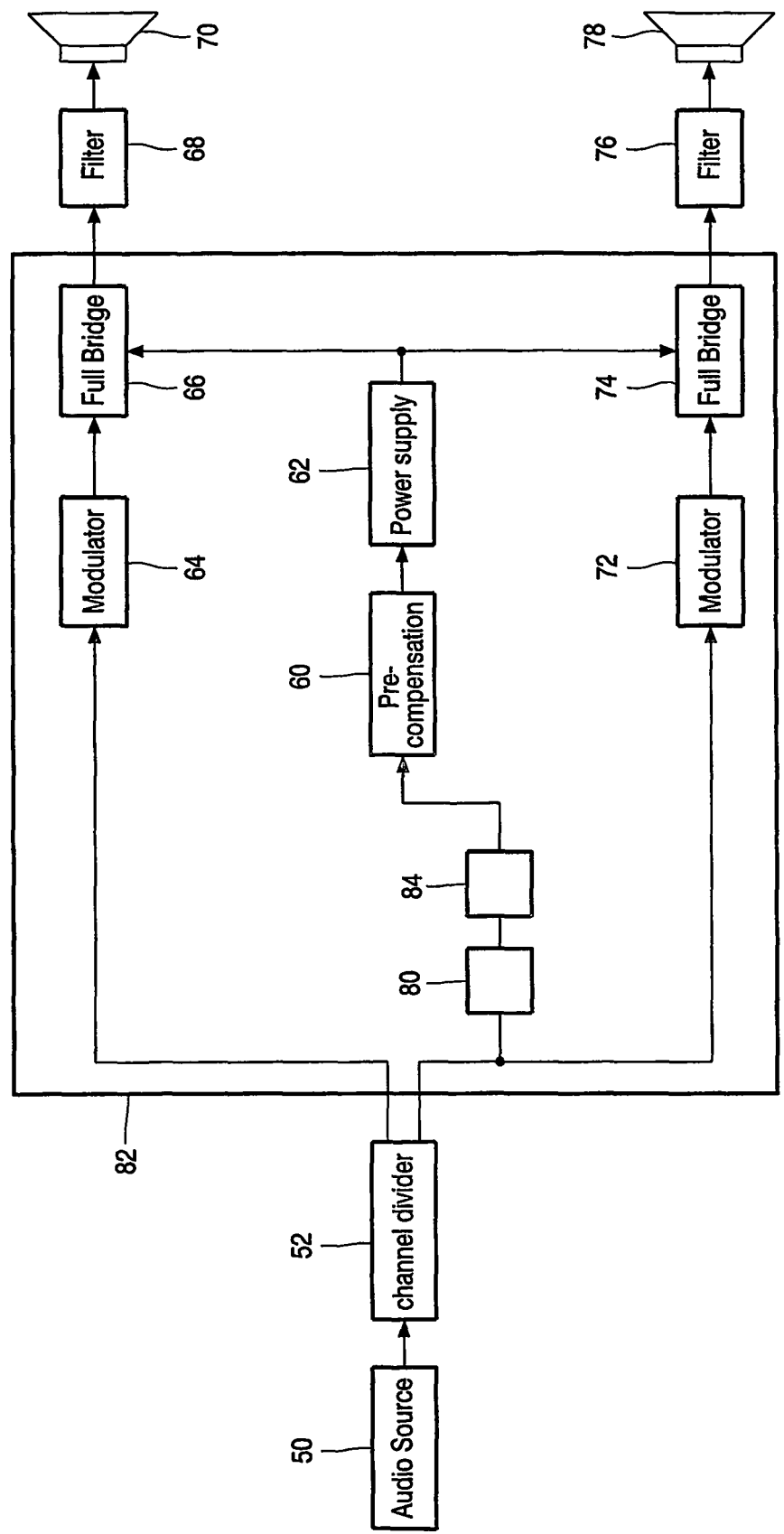
FIG. 4 shows a schematic diagram of a second exemplary embodiment of a digital amplifier system according to the present invention.

In the following, exemplary embodiments of the present invention will be described with reference to the figures. The digital amplifiers depicted in FIGS. 1, 3 and 4 are class D amplifiers, having a full bridge, usually referred to as H-bridge. In spite of the fact that the present invention will be described with reference to exemplary embodiments of class D amplifiers, it is apparent to the skilled person that the present invention is not limited to class D amplifiers, but is applicable to any kind of digital amplifier, where ripples or unwanted disturbances in the power supply voltage cause problems such as distortions in the output signal of the amplifier.

FIG. 1 shows a simplified schematic block diagram of a first exemplary embodiment of a digital amplifier according to the present invention for converting an input signal such as an audio signal to a power output. Reference numeral 2 in FIG. 1 designates an audio source which outputs an audio signal to a modulator 4. The modulator 4 pulse-width modulates the audio signal with a higher frequency square wave, such that the signal output at the output of the modulator 4 includes the audio-signal information as variations in pulse-width of the modulated signal. This modulated signal feeds a set of half bridge switches, usually referred to as H-bridges 6. Usually, each H-bridge consists of two power MOSFETs. The output of the bridge 6 is fed into a filter for filtering the signal before the output signal is applied to a loudspeaker 10. Unlike with class A or B structures, the amplifier load, i.e. the loudspeaker 10 is connected across to the legs of the bridge 6 from the output to the ground. It has to be noted that the present invention may also be implemented in class D half bridge architectures. In case the present invention is applied to class D half bridge architectures, the speaker is then connected to a half supply by means of a series capacitance.

Reference numeral 12 designates a supply ripple pre-compensation circuit which input is connected to the output of the audio source 2 and which output is connected to a power supply 14. The power supply 14 feeds the power supply voltage via a power supply port 16 to the switches of the bridge 6. The supply ripple pre-compensation circuit 12 referred to in FIG. 1 as "pre-compensation" is configured for suppressing or compensating voltage ripples on the supply voltage supplied from the power supply 14 via the supply port 16 to the bridge 6. The supply ripple pre-compensation circuit according to an exemplary embodiment of the present invention, may be one of a digital controller such as a DSP controller and an analog control circuit.

Figure 2:
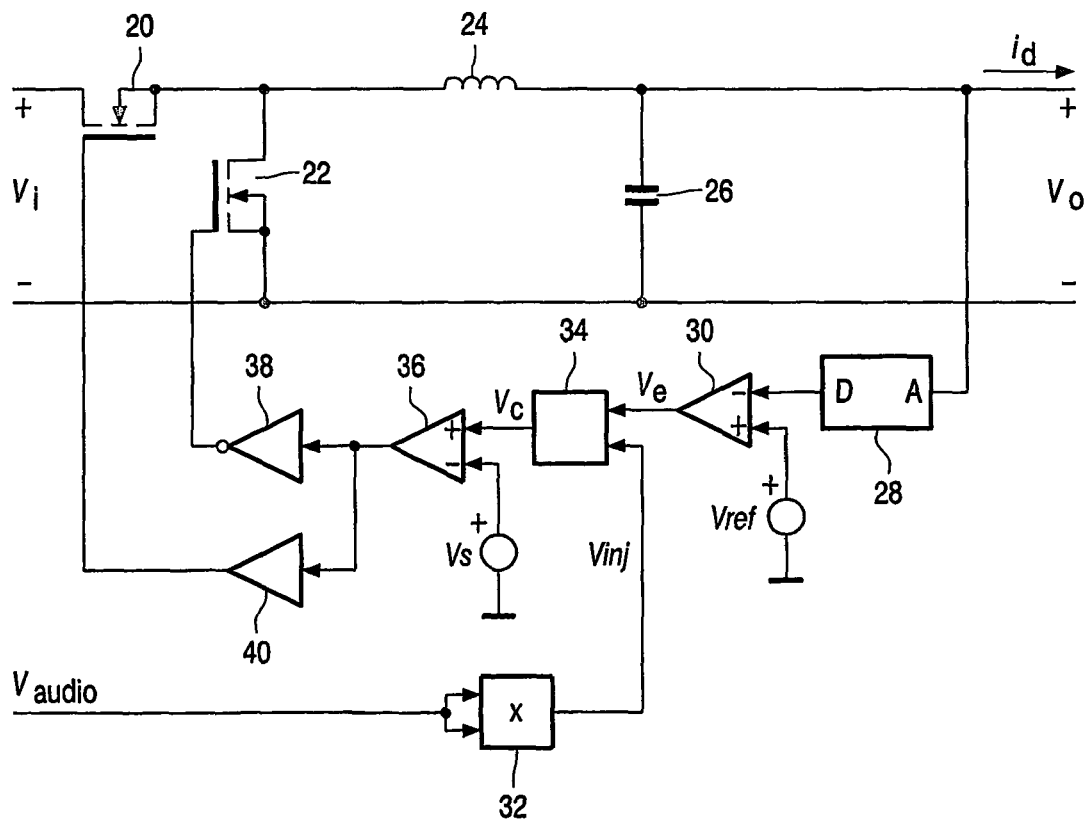
FIG. 2 shows a simplified circuit diagram of an exemplary embodiment of a compensation circuit according to the present invention as it may be used in the digital amplifiers depicted in FIGS. 1, 3 and 4.

FIG. 2 shows a simplified circuit diagram of a supply ripple pre-compensation circuit according to an exemplary embodiment of the present invention, as it may be used in the digital amplifiers or digital amplifier systems depicted in FIGS. 1, 3 and 4. In FIG. 2, reference numerals 20 and 22 designate switches of the full bridge of the class D amplifier, which are realized by means of MOSFETs.

The circuit depicted in FIG. 2 is a buck converter with an audio signal injection for supply ripple pre-compensation according to the present invention. The depicted circuit may be realized by means of a digital circuit such as a DSP.

The power supply not depicted in FIG. 2 provides the voltage $v_0$ to the circuit. The source of the switch 20 and the drain of the switch 22 are connected to an inductivity 24, which is connected to the supply output voltage $v_0$. A capacity 26 is provided between the supply output voltage $v_0$ of the power supply and the source of the switch 22. The supply output voltage $v_0$ is converted into the digital domain by means of an A/D converter 28 and output to an error amplifier 30. The error amplifier 30 compares the digitized supply output voltage $v_0$ to a reference signal $v_{ref}$ and outputs an error signal $v_e$. According to an aspect of the present invention, the error amplifier 30 may be realized by means of a differential amplifier.

The digital audio signal $v_{audio}$ is squared with a multiplying unit 32 and output as the injection signal $v_{inj}$. The injection signal $v_{inj}$ is provided to a summing unit 34 realized by an adder. By the summing unit 34, the injection signal $v_{inj}$ is super-positioned with the error signal $v_e$. The output of the summing unit 34, namely the summing signal $v_c$ is compared to a sawtooth signal $v_s$ by means of a comparator 36 to thereby generate a PWM signal that is provided to the gates of the switches 20 and 22 via the drivers 38 and 40. This PWM signal drives the switches 20 and 22 of the buck converter. Due to the above circuit, a very clean supply voltage can be supplied to the switches 20 and 22 since the square of the audio signal is the fundamental component of the load current $i_d$ drawn by the switches 20 and 22 of the amplifier.

According to an aspect of the present invention, the power supply ripple pre-compensation circuit 12, the modulator 4, the full bridge 6 and/or the filter 8 are integrated in a module or integrated circuit.

FIG. 3 shows a first exemplary embodiment of a digital amplifier system 80 according to the present invention. The digital amplifier system 80 depicted in FIG. 3 is a multi-channel application, where only one supply ripple pre-compensation circuit 60 is used for compensating voltage ripples on a supply voltage supplied to a plurality of bridge circuits 66 and 74 of a plurality of digital amplifiers. In FIG. 3, an audio source 50 outputs a digital audio signal to a channel divider, which separates channels of the digital audio. In the exemplary embodiment depicted in FIG. 3, only two channels are shown. However, the present invention may also be applied to architectures using more than two channels. Therefore, for example the left channel of the audio signal is provided to the upper branch of the amplifier system 80, whereas the right channel is provided to the lower branch of the amplifier system 80 depicted in FIG. 3. Those individual channels of the audio signal are the input signals of the amplifier system 80. The left channel is squared by means of a multiplier 54 and provided to a summing unit 58. Also, the right channel is squared by means of a multiplier 56 and provided to the summing unit 58. The summing unit 58 adds the squared right channel to the squared left channel and provides the summing signal to the supply ripple pre-compensation circuit 60. As already mentioned above the supply ripple pre-compensation circuit 60 may have the same arrangement as the supply ripple pre-compensation circuit depicted in FIG. 2. The supply ripple pre-compensation circuit 60 controls the power supply 62 such that the power supply 62 provides a clean supply voltage to the full bridges 66 and 74 of the upper and lower branch of the digital amplifier depicted in FIG. 3. The full bridges 66 and 74 convert the right and left channels, which were pulse-width modulated by means of the modulators 64 and 72, to power outputs provided to loudspeakers 70 and 78 via filters 68 and 76.

According to this exemplary embodiment of the present invention, a plurality of input signals (the channels of the audio signal) are combined and used for supply ripple pre-compensation of a plurality of amplifier stages (upper and lower branches of amplifier systems 80). The summing signal provided from the summing unit 58 to the supply ripple pre-compensation circuit 60 represents the total energy being drawn from the power supply. Therefore, a very fast just in time compensation can be realized, allowing for an almost distortion free output signal to the loudspeakers 70 and 78.

FIG. 4 shows a simplified schematic diagram of a second exemplary embodiment of a digital amplifier system 82 according to the present invention, for converting a plurality of input signals, namely the individual channels of the audio signal to a plurality of power outputs provided to the loudspeakers 70 and 78. In FIG. 4, the same reference numerals as in FIG. 3 are used to designate the same or corresponding elements. As in FIG. 3, only two channels are shown in FIG. 4. However, the present invention may also be applied to systems using more than two channels. In contrast to the embodiment depicted in FIG. 3, only one channel, namely the right channel of the right and left channels of the audio signal is input to the supply ripple pre-compensation circuit 60. In detail, the right channel of the audio signal output by the channel divider 52 is low pass filtered by means of a low pass filter 80, which output signal is provided as input signal to a squaring device 84. This squaring device 84 is provided for estimation of the energy requirements. Instead of being provided between the low pass filter 80 and the supply ripple pre-compensation circuit 60, the squaring device 84 may also be provided according to an aspect of the present invention before the low pass filter 80, i.e. between the channel divider 52 and the low pass filter 80. This exemplary embodiment of the present invention advantageously makes use of the fact that most of the audio signal content is in the low-frequency range of the audio signal. Therefore, the audio signal being fed forward, i.e. being input to the supply ripple pre-compensation circuit 60 advantageously may previously be low pass filtered by means of the low pass filter 80 to ease the power supply controller without having a loss of performance.

It has to be noted that in spite of the fact that the right channel of FIG. 4 is used as input for the supply ripple pre-compensation circuit 60, also the left one or any other channel of the plurality of channels of an audio signal may be used as input signal for the pre-compensation. This exemplary embodiment of the present invention may advantageously be used for surround sound systems. In such applications, preferably the sub-woofer channel of the audio signal is the channel which is branched out, low pass filtered, squared and then used for pre-compensation by means of the supply ripple pre-compensation circuit. This aspect of the present invention allows for a very good pre-compensation and therefore for a very clean output signal, since the sub-woofer channel transmits the frequency portions with the highest energy.

Furthermore, this exemplary embodiment of the present invention uses the fact that the low frequency content of the audio signal is common to all channels. Therefore, according to the present invention, it is sufficient to only use one low pass filtered channel for pre-compensation of all amplified channels. Advantageously, according to the present invention, this allows to reduce the overall size and cost of the amplifier. As already mentioned above, the elements depicted in FIGS. 3 and 4 except for the audio source 50 and/or the filters 68 and 76 and the loudspeakers 70 and 78 may be integrated in one integrated circuit IC or module.

The invention claimed is:

1. Digital amplifier for converting an input signal to a power output, comprising: a bridge circuit with at least one pair of switches; and a supply ripple pre-compensation circuit for compensating voltage ripples on a supply voltage supplied to the bridge circuit; wherein the supply ripple pre-compensation circuit compensates the voltage ripples on the supply voltage based on the input signal.

2. The digital amplifier according to claim 1, wherein the input signal is an audio signal; wherein the audio signal is filtered by means of a filter; and wherein only a part of a frequency content of the audio signal is fed forward for pre-compensating ripples on the supply voltage.

3. The digital amplifier according to claim 1, wherein the supply ripple pre-compensation circuit is one of a digital controller and an analogue control circuit; and wherein the digital amplifier is a class D amplifier.

4. Digital amplifier system for converting a plurality of input signals to a plurality of power outputs, comprising: a plurality of bridge circuits, each bridge circuit including at least one pair of switches; and a supply ripple pre-compensation circuit for compensating voltage ripples on a supply voltage supplied to the plurality of bridge circuits; wherein the supply ripple pre-compensation circuit compensates the voltage ripples on the supply voltage based on at least one input signal of the plurality of input signals.

5. The digital amplifier system according to claim 4, further comprising a combination circuit; wherein the plurality of input signals are channels of an audio signal; wherein the combination circuit combines the plurality of input signals to one signal which is applied to the supply ripple pre-compensation circuit.

6. The digital amplifier system according to claim 5, wherein the combination circuit comprises: a squaring circuit and an adder; wherein the plurality of input signals are individually squared by means of the squaring circuit and then added by means of the adder for combining the plurality of input signals to the one signal which is applied to the supply ripple pre-compensation circuit.

7. The digital amplifier according to claim 1 further comprising a squaring device configured to square a subwoofer channel audio signal, and wherein the supply ripple pre-compensation circuit compensates the voltage ripples on the supply voltage based on the squared subwoofer channel audio signal.

8. Compensation circuit for connection between a power supply and a class D amplifier, wherein the class D amplifier converts an input signal to a power output and wherein the class D amplifier includes at least one pair of switches, the compensation circuit comprising: a supply ripple pre-compensation circuit for compensating voltage ripples on a supply voltage provided by the power supply and supplied to the at least one pair of switches; wherein the supply ripple pre-compensation circuit compensates the voltage ripples on the supply voltage based on the input signal.

9. The compensation circuit according to claim 8, wherein the input signal is an audio signal; wherein the audio signal is filtered by means of a filter; wherein only a part of a frequency content of the audio signal is fed forward for pre-compensating ripples on the supply voltage; and wherein the supply ripple pre-compensation circuit is one of a digital controller and an analogue control circuit.

10. The compensation circuit according to claim 8 further comprising a squaring device configured to square a subwoofer channel audio signal, and wherein the supply ripple pre-compensation circuit compensates the voltage ripples on the supply voltage based on the squared subwoofer channel audio signal.

11. Method of operating a class D amplifier which converts an input signal to a power output, the class D amplifier including a bridge circuit, the method comprising the steps of: pre-compensating voltage ripples on a supply voltage supplied to the bridge circuit on the basis of the input signal.

12. The method according to claim 11, wherein the input signal is filtered by means of a filter; and wherein thus only a part of a frequency content of the input signal is fed forward for pre-compensating ripples on the supply voltage.

13. The method of claim 11, further comprising the steps of: individually squaring a plurality of channels of an audio signal; adding the individually squared channels of the audio signal to form the input signal; supplying a plurality of bridge circuits of a plurality of digital amplifiers corresponding to the plurality of different channels with the pre-compensated supply voltage to thereby perform the pre-compensation of voltage ripples on the supply voltage of the plurality of bridge circuits of the plurality of digital amplifiers.

14. The method of claim 11, further comprising the steps of: squaring a subwoofer channel audio signal; using the squared subwoofer channel audio signal as the input signal for the pre-compensation; supplying a plurality of bridge circuits of a plurality of digital amplifiers corresponding to a plurality of different channels with the pre-compensated supply voltage to thereby perform the pre-compensation of voltage ripples on the supply voltage of the plurality of bridge circuits of the plurality of digital amplifiers.

* * * * *